(12) United States Patent
Shinma

(10) Patent No.: US 8,174,107 B2
(45) Date of Patent: May 8, 2012

(54) STACKED SEMICONDUCTOR DEVICES AND A METHOD FOR FABRICATING THE SAME

(75) Inventor: Yasuhiro Shinma, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 506 days.

(21) Appl. No.: 12/337,396

(22) Filed: Dec. 17, 2008

(65) Prior Publication Data

US 2009/0315166 A1   Dec. 24, 2009

(30) Foreign Application Priority Data

Dec. 18, 2007   (JP) ................................. 2007-325813

(51) Int. Cl.
*H01L 29/72*   (2006.01)

(52) U.S. Cl. ......... 257/686; 257/696; 257/735; 257/773

(58) Field of Classification Search .................. 257/686, 257/696, 735, 773
See application file for complete search history.

(56) References Cited

U.S. PATENT DOCUMENTS 5,801,439 A * 9/1998 Fujisawa et al. .............. 257/686
* cited by examiner

*Primary Examiner* — Edward Wojciechowicz

(57) ABSTRACT

The present invention provides a semiconductor device that includes semiconductor packages arranged in a stacked configuration. A plurality of leads are drawn from the stacked semiconductor packages and folded around the outer shape of each semiconductor package such that the leads extend over the upper surfaces of the semiconductor package. Holders affix the stacked semiconductor packages so that first and second leads contact each other, the first leads being drawn from a first one of the stacked semiconductor packages at a lower stacking stage, and the second leads being drawn from a second one of the stacked semiconductor packages at an adjacent, upper stacking stage.

13 Claims, 10 Drawing Sheets

STACKED SEMICONDUCTOR DEVICES AND A METHOD FOR FABRICATING THE SAME

CROSS REFERENCE TO RELATED APPLICATIONS

This application claims the priority benefit of JP Application No. 2007-325813, filed Dec. 18, 2007, which is hereby incorporated in its entirety.

TECHNICAL FIELD

This invention relates generally to semiconductor devices and methods for fabricating the same, and more particularly, to a semiconductor device in which multiple semiconductor packages are stacked and a method for fabricating the same.

BACKGROUND

In accordance with the demand for higher density semiconductor devices, a semiconductor device on which multiple semiconductor packages are mounted has been developed. In order to reduce the mount area of the semiconductor device, a PoP (Package on Package) technique in which multiple semiconductor packages are stacked is used.

Japanese Patent Application Publication No. 9-283702 (hereinafter described as Document 1) discloses an arrangement of holding leads with clips, the leads being drawn from the semiconductor packages. Japanese Patent Application Publication No. 11-87601 (hereinafter described as Document 2) discloses an arrangement of stacking semiconductor packages by bending leads around the outer shape of each semiconductor package, the leads being drawn from the semiconductor packages.

However, when a defective semiconductor package is discovered in a plurality of semiconductor packages that have already been stacked, it is not easy to remove and replace the defective semiconductor package with a replacement semiconductor package. This increases the cost of fabricating the semiconductor devices.

SUMMARY

The present invention has been made in view of the above circumstances and provides a semiconductor device in which a defective semiconductor package is easily replaceable even after stacking.

According to a first aspect of the present invention, there is provided a semiconductor device, including: a plurality of semiconductor packages arranged in a stacked configuration; leads that are drawn from the stacked semiconductor packages and folded around the outer shapes of the stacked semiconductor packages and then extended over upper surfaces of the semiconductor package; and holders that affix the stacked semiconductor packages so that first and second leads contact each other, the first leads being drawn from a first one of the stacked semiconductor packages at a lower stacking stage, and the second leads being drawn from a second one of the stacked semiconductor packages at an upper stacking stage.

According to a second aspect of the present invention, there is provided a method for fabricating a semiconductor device including: arranging leads drawn from semiconductor packages so as to be folded around outer shapes of the semiconductor packages and to be extended over the upper surfaces of the semiconductor packages; stacking the semiconductor packages so that a first plurality of leads drawn from a first one of the semiconductor packages stacked at a lower stacking stage make contact with a second plurality of leads drawn from a second one of the semiconductor packages stacked at an adjacent, upper stacking stage; and affixing the stacked semiconductor packages with holders.

DETAILED DESCRIPTION

A description will now be given of embodiments of the present invention with reference to the accompanying drawings.

Figure 1A:
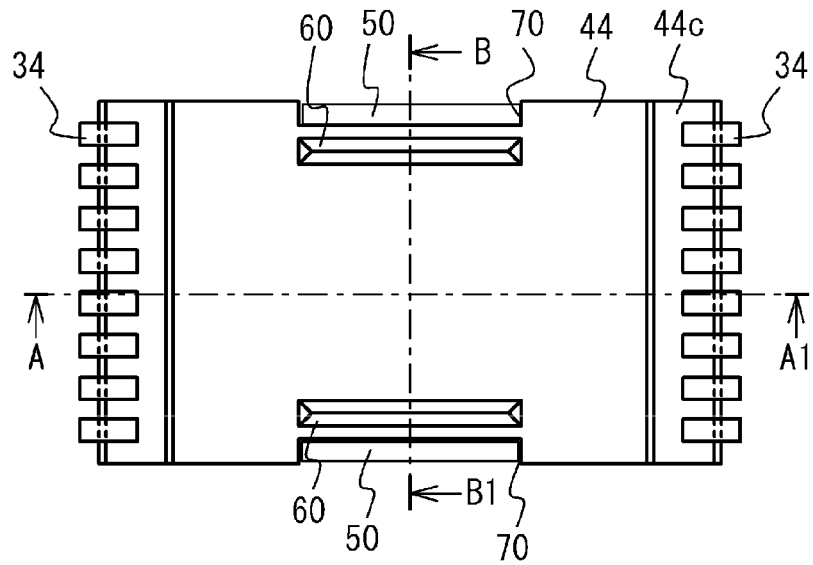
FIG. 1A is a top view of a semiconductor device in accordance with an embodiment of the present invention.
Figure 1B:
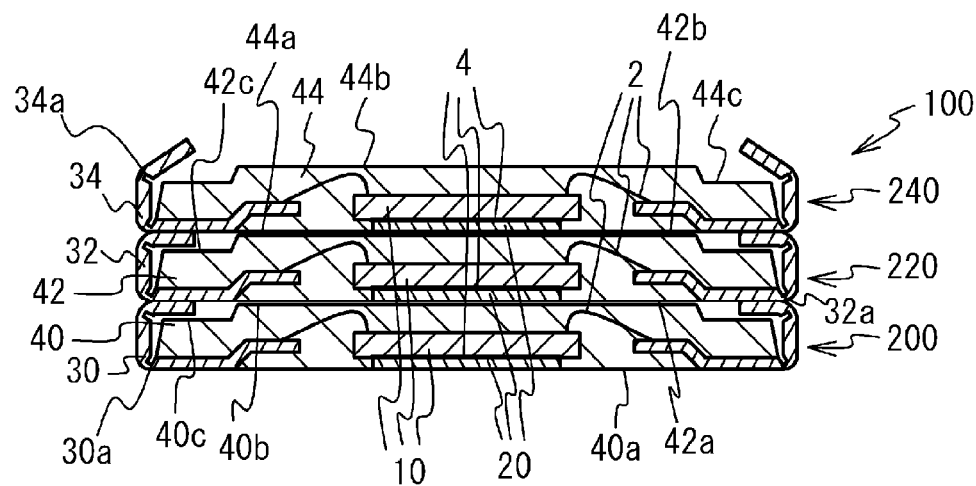
FIG. 1B is a cross-sectional view thereof taken along a line A-A1 in FIG. 1A.
Figure 1C:
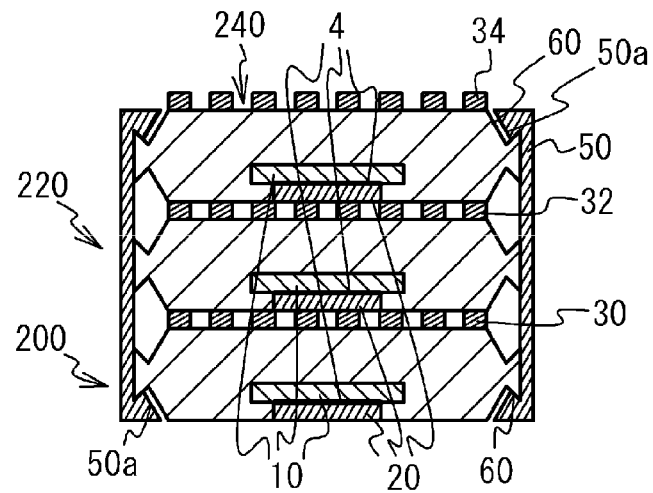
FIG. 1C is another cross-sectional view thereof taken along a line B-B1 in FIG. 1A.

FIG. 1A is a top view of a semiconductor device 100 in accordance with an embodiment, FIG. 1B is a cross-sectional view thereof taken along a line A-A1 in FIG. 1A, and FIG. 1C is another cross-sectional view thereof taken a line B-B1 in FIG. 1A.

As depicted in FIG. 1B, the semiconductor device 100 is composed of a first semiconductor package 200, a second semiconductor package 220 and a third semiconductor package 240. The second semiconductor package 220 is stacked on the first semiconductor package 200, and the third semiconductor package 240 is stacked on the second semiconductor package 220.

The individual semiconductor packages are now described by exemplarily explaining the first semiconductor package 200 with reference to FIG. 1B. A semiconductor chip 10, which may, for example, be made of silicon, is die-bonded to a die stage 20 with an adhesive 4. The semiconductor chip 10 is connected with first leads 30 via bonding wires 2. The bonding wires 2, the semiconductor chip 10, a die stage 20 and a part of each of the first leads 30 are molded with a resin 40, which may, for example, be epoxy resin. A part of each first lead 30 is drawn out to an external portion of the resin 40 from an underside 40a of the resin 40. The first leads 30 are bent or folded around the outer shape of the resin 40 and are extended up to the upper surface of the resin 40. On the upper surface of the resin 40, there are cutout areas 40c above which the first leads 30 extend. The height from the bottom to the upper surface including the cutout areas 40c is lower than that from the bottom to an upper surface 40b excluding the cutout area 40c. A folded portion of each of the first leads 30 (hereinafter described as a folded portion 30a) is thinner than another portion excluding the folded portion 30a defined by half etching, for example. The second semiconductor package 220 and the third semiconductor package 240 have the same arrangement as described above.

As shown in FIG. 1B, the second semiconductor package 220 is stacked on the first semiconductor package 200. A part of each of the first leads 30 that is extended to the upper surface of the resin 40 of the first semiconductor package 200 contacts a part of a corresponding second lead 32 that is drawn out to an external portion of a resin 42 of the second semiconductor package 220 from an underside 42a thereof. The second leads 32 are provided on the second semiconductor package 220. In the same way, the third semiconductor package 240 is stacked on the second semiconductor package 220, and the second leads 32 and third leads 34 contact each other.

As shown in FIGS. 1A and 1C, the stacked first, second and third semiconductor packages 200, 220 and 240 are fixed with holders 50. Grooves 50 for engaging protrusions 50a of the holders 50 are provided on the underside of the first semiconductor package 200 arranged in the lowermost stacking stage and on the upper surface of the third semiconductor package 240 arranged in the uppermost stacking stage. Further, as shown in FIG. 1A, there are provided side surface grooves 70 on the opposing side surfaces of the resin of each semiconductor package on which the holders 50 are attached.

Now, an explanation is given, with reference to FIGS. 2 through 10C, of a method of fabricating the semiconductor device 100 in accordance with the present embodiment.

Figure 2:
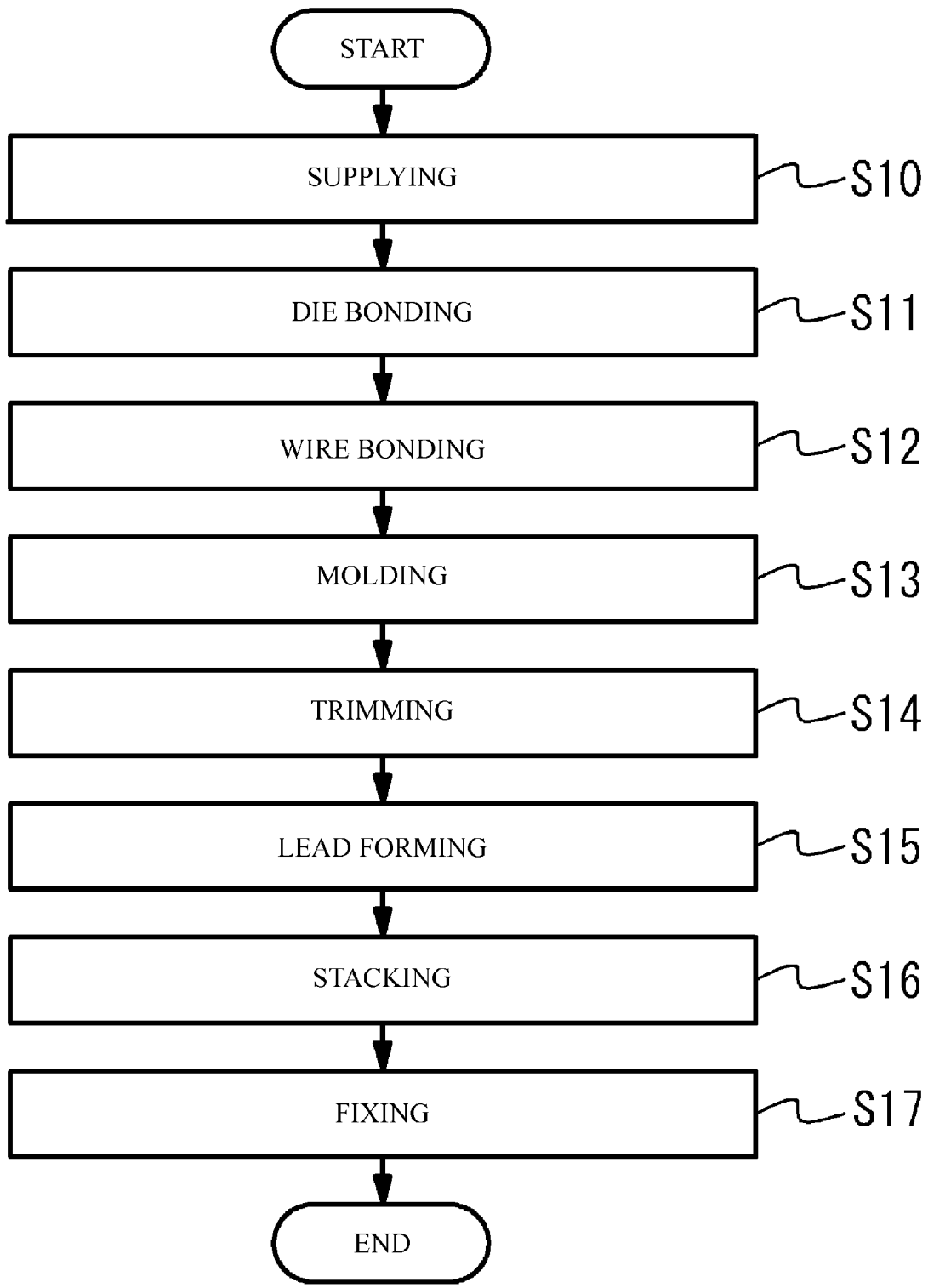
FIG. 2 is a flowchart showing a fabricating process of the semiconductor device in accordance with an embodiment of the present invention.

FIG. 2 is a flowchart of a fabricating process of the semiconductor device 100. In the following, steps S10 through S15 will be exemplarily described in connection with the first semiconductor package 200.

Figure 3A:
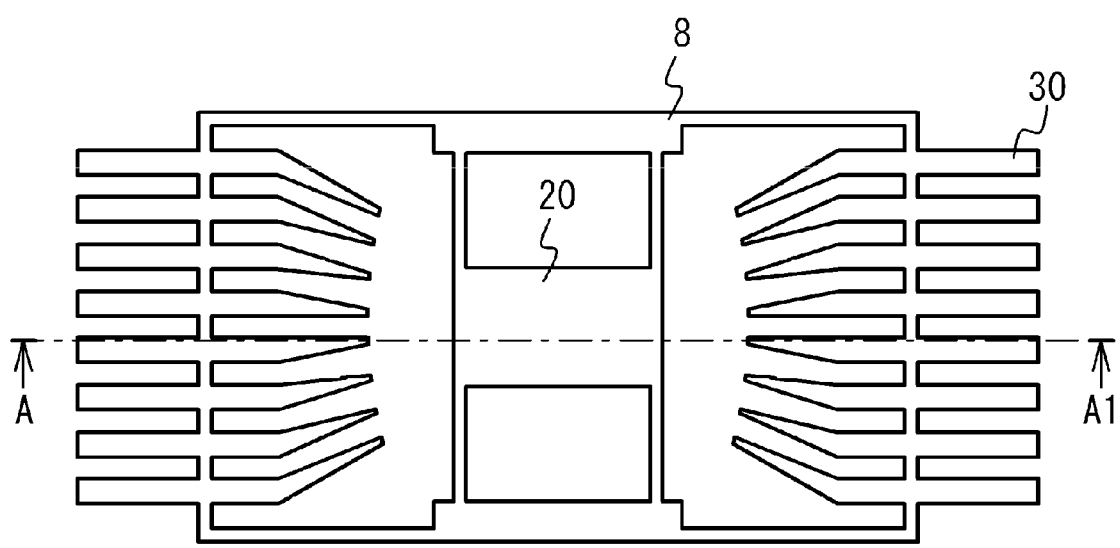
FIG. 3A is a top view of a process of supplying a lead frame in accordance with the embodiment.
Figure 3B:
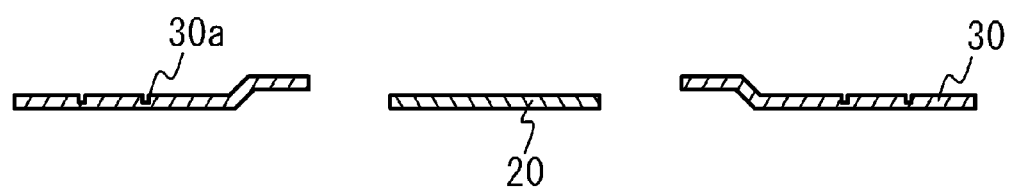
FIG. 3B is a cross-sectional view thereof taken along a line A-A1 in FIG. 3A.

FIG. 3A is a top view showing a process of supplying a lead frame in step S10, and FIG. 3B is a cross-sectional view taken along a line A-A1 in FIG. 3A. In this process, the lead frame is supplied to the fabricating device. The lead frame is composed of the die stage 20, the first leads 30 and side rails 8. The folded portions 30a provided in the first leads 30 are thinner than the other portions defined by, for example, half etching.

Figure 4A:
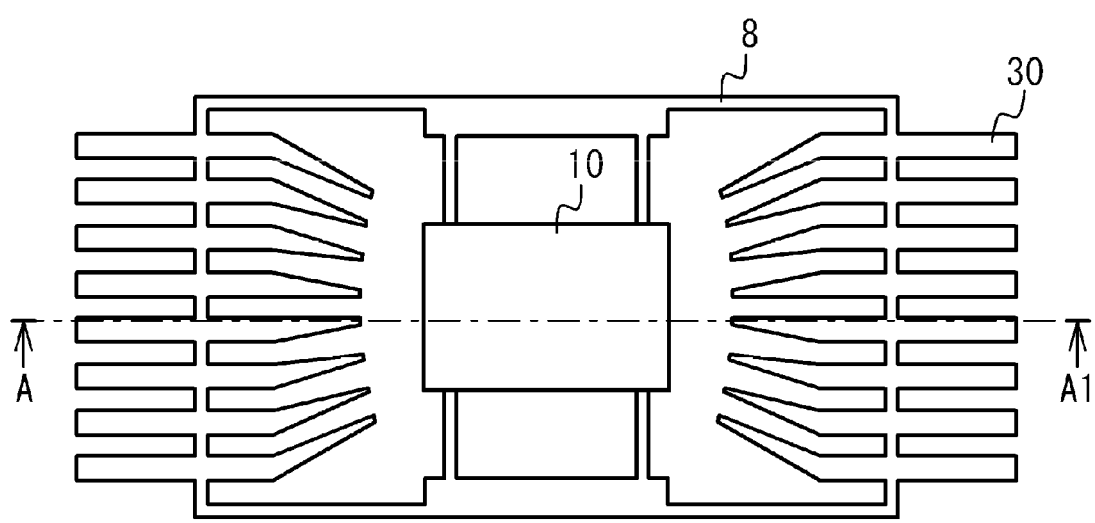
FIG. 4A is a top view of a process of die-bonding in accordance with an embodiment of the present invention.
Figure 4B:
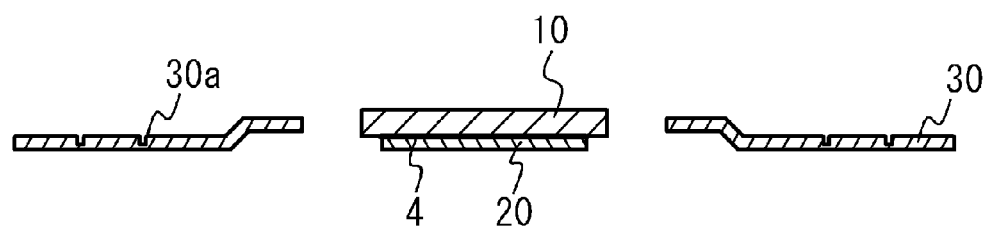
FIG. 4B is a cross-sectional view thereof taken along a line A-A1 in FIG. 4A.

FIG. 4A is a top view showing a process of die-bonding in step S11, and FIG. 4B is a cross-sectional view taken along a line A-A1 in FIG. 4A. As shown in FIGS. 4A and 4B, the semiconductor chip 10 is die-bonded to the die stage 20 with the adhesive material 4.

Figure 5A:
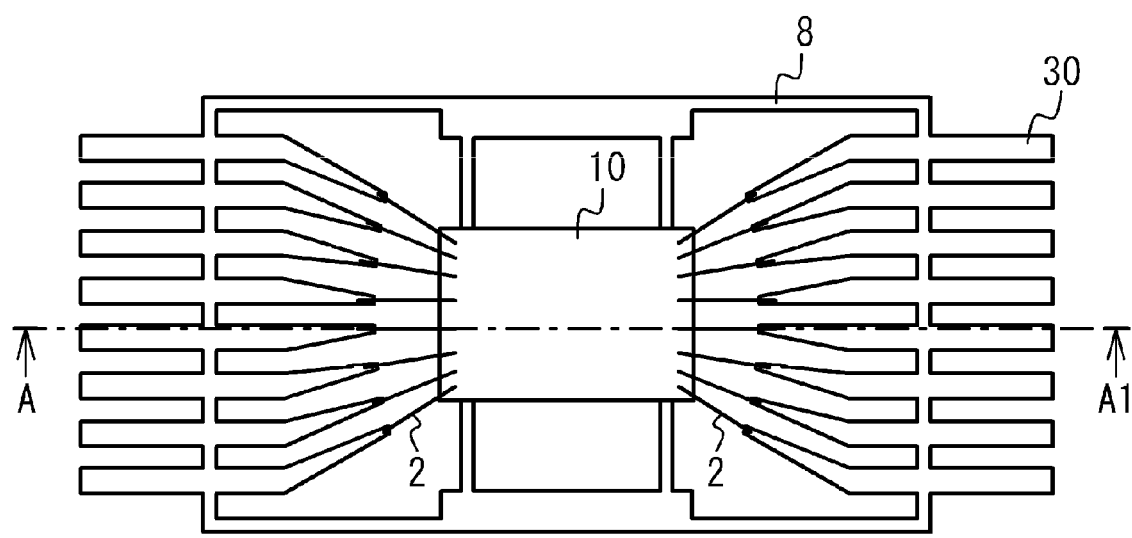
FIG. 5A is a top view of a process of wire bonding in accordance with an embodiment of the present invention.
Figure 5B:
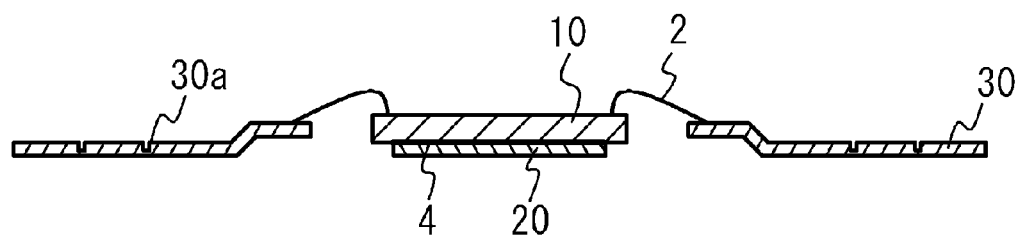
FIG. 5B is a cross-sectional view thereof taken along a line A-A1 in FIG. 5A.

FIG. 5A is a top view showing a process of wire bonding in step S12, and FIG. 5B is a cross-sectional view taken along a line A-A1 in FIG. 5A. In this process, the semiconductor chip 10 and the first leads 30 are electrically connected using the bonding wires 2.

Figure 6A:
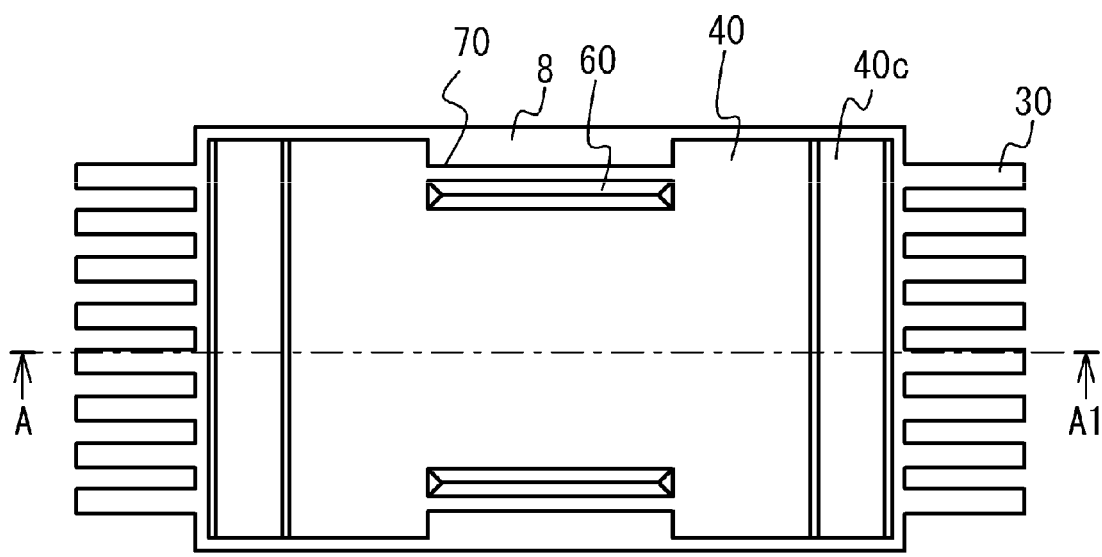
FIG. 6A is a top view of a process of molding in accordance with an embodiment of the present invention.
Figure 6B:
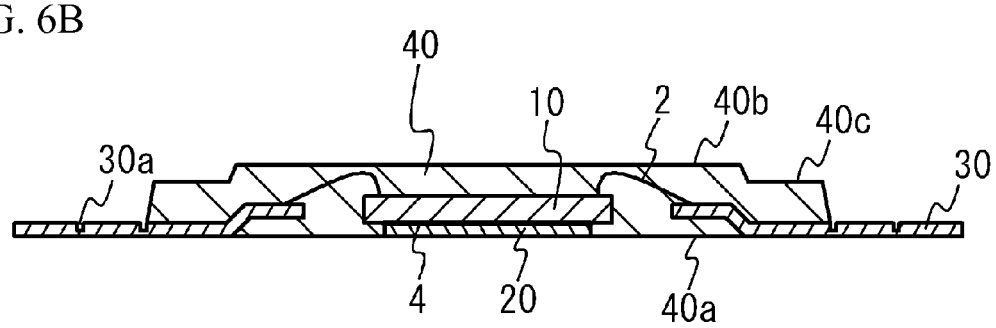
FIG. 6B is a cross-sectional view thereof taken along a line A-A1 in FIG. 6A.

FIG. 6A is a top view showing a process of molding in step S13, and FIG. 6B is a cross-sectional view taken along a line A-A1 in FIG. 6A. In this process, the bonding wire 2, the semiconductor chip 10, the die stage 20 and a part of each the first leads 30 is sealed with the resin 40. As shown in FIG. 6B, a part of each first lead 30 is drawn out from the underside 40a of the resin 40 to the external portion thereof. As shown in FIG. 6A, the cutout areas 40c are defined on the upper surface of the resin 40 along the areas where the first leads 30 are arranged. Further, the grooves 60 (the grooves 60 at the underside are not depicted) are respectively defined along the areas where the first leads 30 are not arranged on the lower and upper surfaces of the resin 40. Side surface grooves 70 are formed on side surfaces of the resin along the grooves 60, and may have a length approximately equal to that of the grooves 60.

Figure 7A:
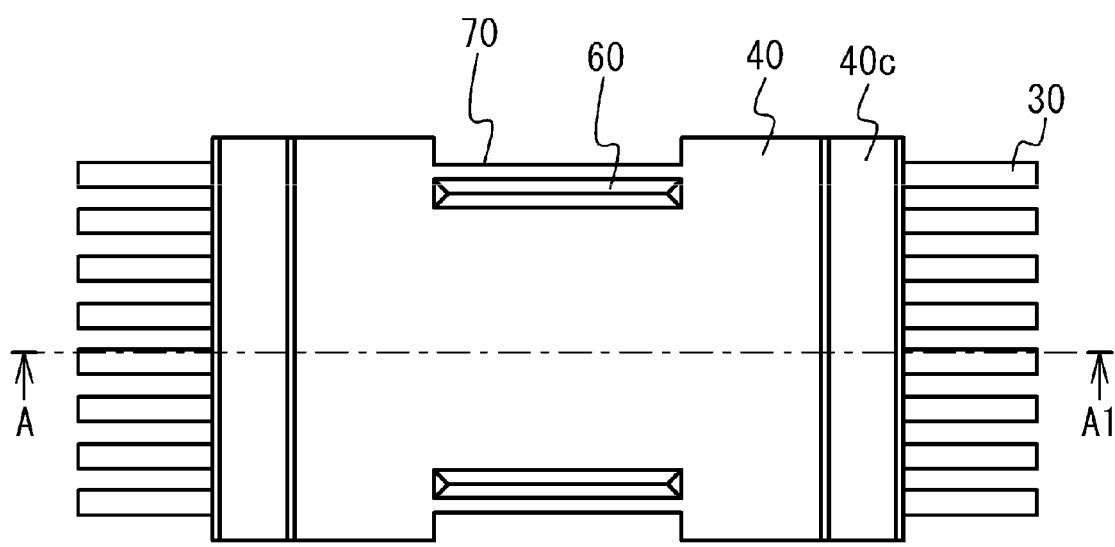
FIG. 7A is a top view of a process of trimming in accordance with an embodiment of the present invention.
Figure 7B:
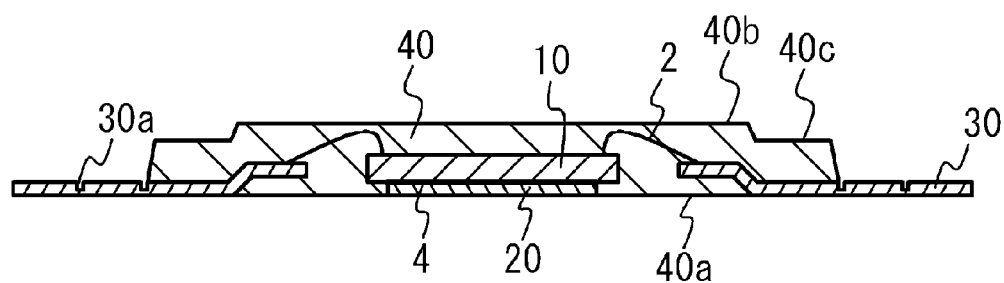
FIG. 7B is a cross-sectional view thereof taken along a line A-A1 in FIG. 7A.

FIG. 7A is a top view showing a process of trimming in step S14, and FIG. 7B is a cross-sectional view taken along a line A-A1 in FIG. 7A. As shown in FIG. 7B, the side rails 8 exposed to external portion of the resin 40 are removed in this process.

Figure 8A:
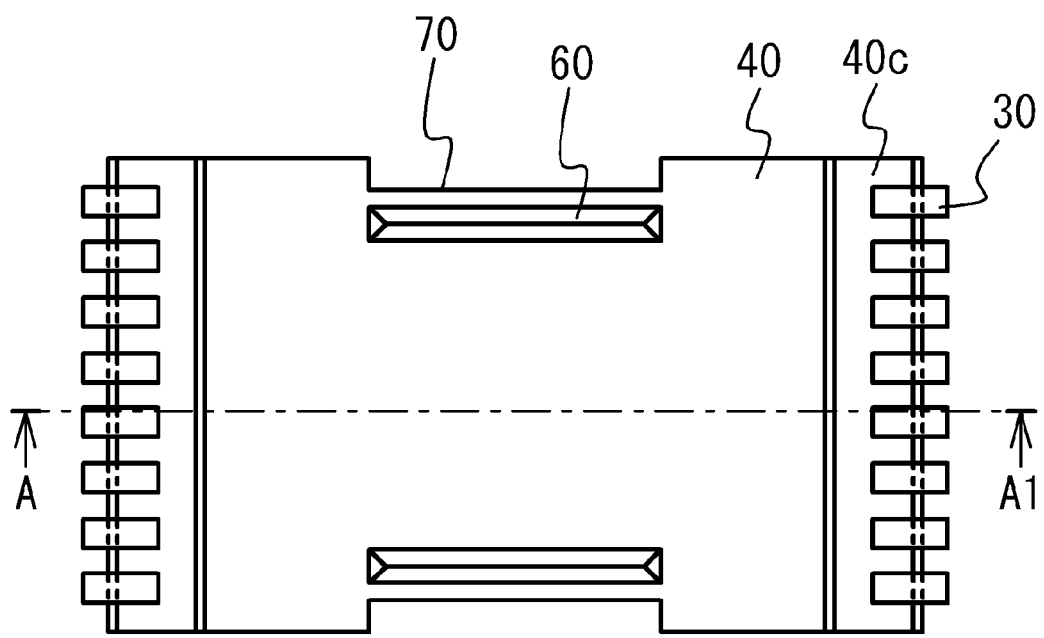
FIG. 8A is a top view of a process of lead forming in accordance with an embodiment of the present invention.
Figure 8B:
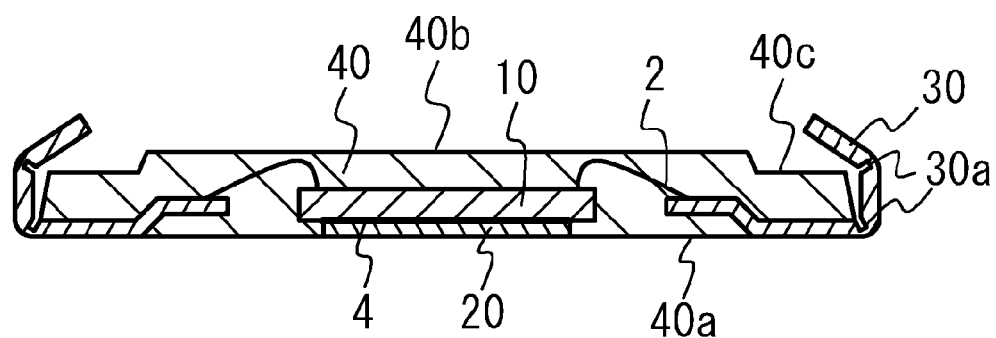
FIG. 8B is a cross-sectional view thereof taken along a line A-A1 in FIG. 8A.

FIG. 8A is a top view showing a process of lead forming in step S15, and FIG. 8B is a cross-sectional view taken along a line A-A1 in FIG. 8A. As shown in FIG. 8B, the first leads 30 are extended to the cutout area 40c provided on the upper surface of the resin 40 by folding along the outer shape of the resin 40 folded at the folded portions 30a which are thinner than the other part. Then, the first leads 30 are folded so that tips of the first leads 30 point obliquely upward against the upper surface of the resin 40, and the tips and peripheral portions thereof protrude upward from the upper surface 40b of the resin 40.

Figure 9A:
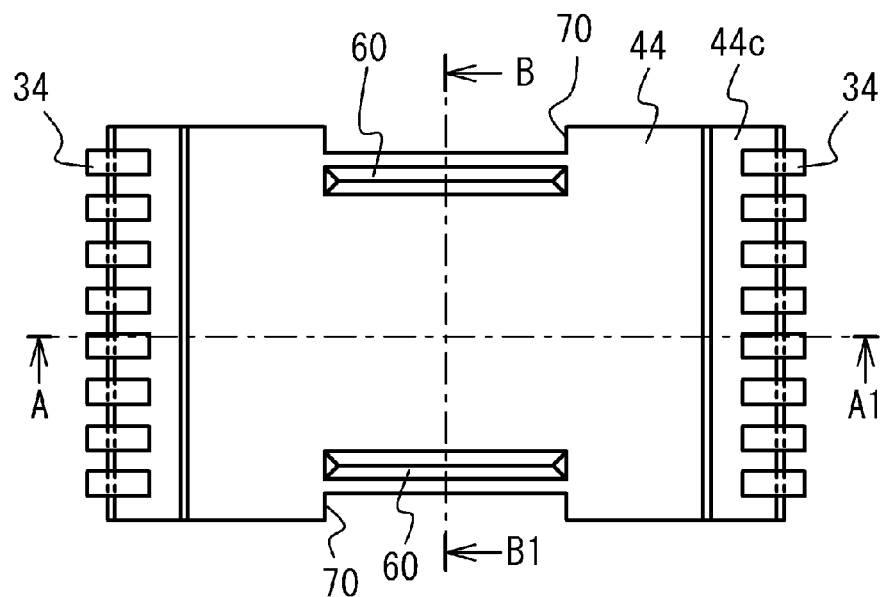
FIG. 9A is a top view of a process of stacking in accordance with an embodiment of the present invention.
Figure 9B:
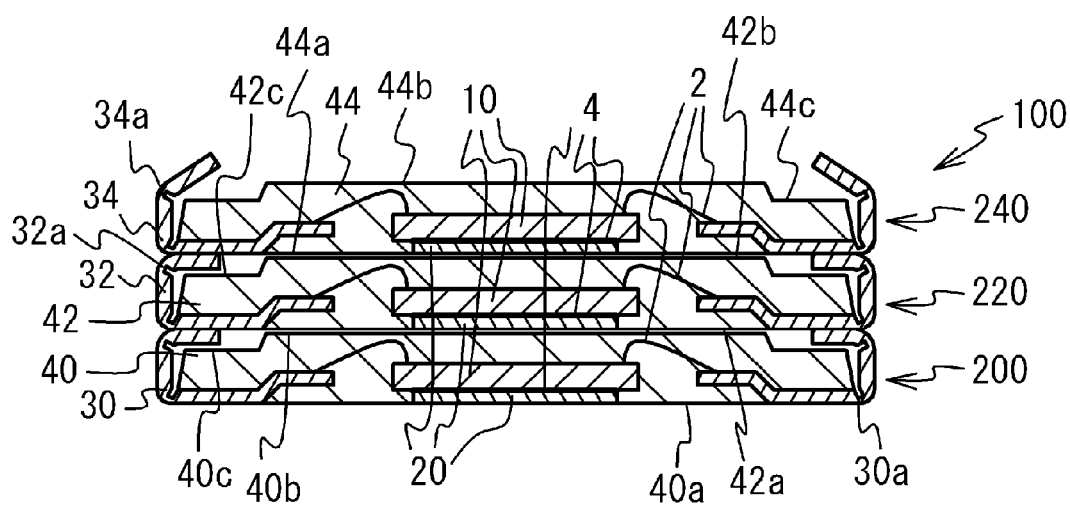
FIG. 9B is a cross-sectional view thereof taken along a line A-A1 in FIG. 9A.

FIG. 9A is a top view showing a process of stacking in step S16, and FIG. 9B is a cross-sectional view taken along a line A-A1 in FIG. 9A. As shown in FIGS. 9A and 9B, the second semiconductor package 220 is stacked on the first semiconductor package 200 so that the second leads 32 are laid on the first leads 30. Further, the third semiconductor package 240 is stacked on the second semiconductor package 220 so that the third leads 34 are laid on the second leads 32. As explained in step S15, a part of each first lead 30 protrudes upward from the upper surface 40a of the resin 40. Thus, the first leads 30 are borne down by the second lead 32 as shown in FIG. 9B. At this moment, an elastic force is generated on the first leads 30 in a direction of lifting the second leads 32, and similarly, an elastic force is generated on the second leads 32 in a direction of lifting the third leads 34. Thus, the first and second leads 30 and 32 contact each other, and the second and third leads 32 and 34 contact each other, so that electrical connections between the semiconductor packages can be made.

Figure 10A:
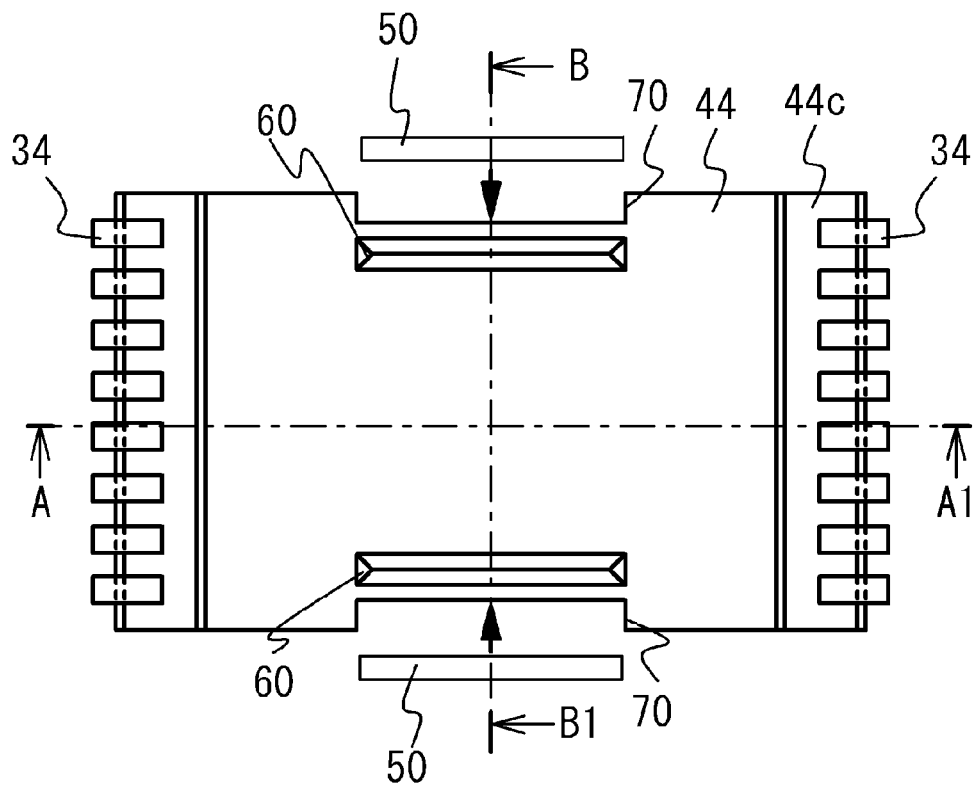
FIG. 10A is a top view of a process of fixing in accordance with an embodiment of the present invention.
Figure 10B:
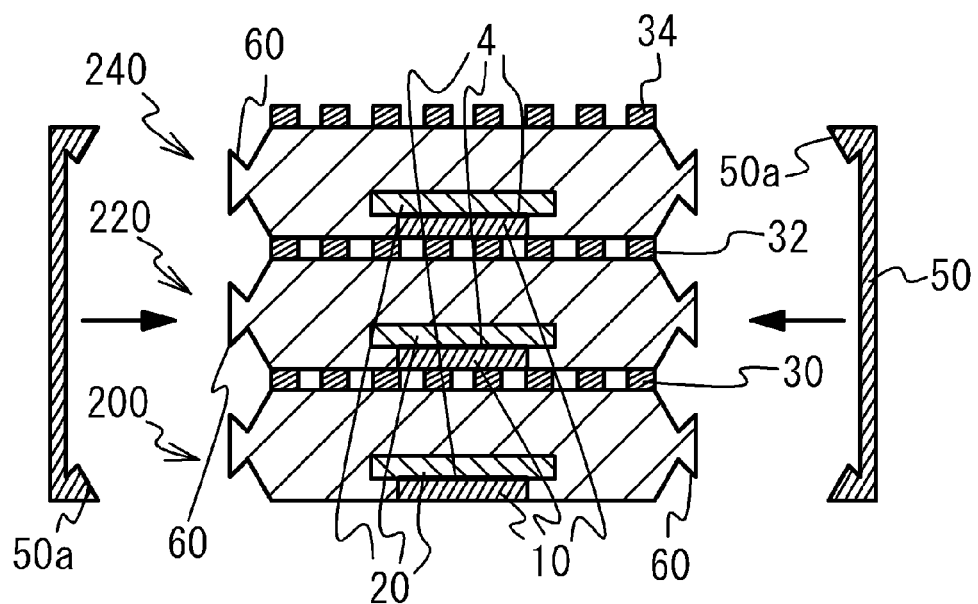
FIG. 10B is a cross-sectional view thereof taken along a line B-B1 in FIG. 10A.

FIG. 10A is a top view showing a process of fixing in step S17, and FIG. 10B is a cross-sectional view taken along a line B-B1 in FIG. 10A. As shown in FIG. 10A, the holders 50 are inserted into the side surface grooves 70 provided on the side surfaces of each semiconductor package. And as shown in FIG. 10B, the protrusions 50a of the holders 50 are engaged with the grooves 60 that are provided on the underside of the first semiconductor package 200 in the lowermost position and on the upper surface of the third semiconductor package 240 in the uppermost position. Thus, the stacked semiconductor packages are fixed more firmly.

In accordance with the embodiment, the semiconductor device 100 is fixed with the holders 50. Thus, a defective piece included in the stacked semiconductor packages may be easily replaced with a new one by removing the holders 50 even after stacking. It is thus possible to reduce the cost of fabricating the semiconductor devices.

The cutout area on the upper surface of each resin of the semiconductor package makes it possible to realize a reduced height of the semiconductor device 100.

The holders 50 may be made of resin, metal, or ceramics. Preferably, the holders 50 are elastic in order to prevent the holders 50 from being damaged when the rigidity of the holders 50 is high. Further, the semiconductor device 100 is annealed in a post-process. Annealing causes expansion of the holders 50, which may be thus disengaged. In order to avoid this, it is preferable that the material for the holders 50 have a thermal expansion coefficient approximately equal to or smaller than that of the resin 40, which may typically be epoxy resin. Preferably, the holders 50 have heat resistance. Typically, the holders 50 may be made of fluorine resin such as PEEK (polyether, ether, ketone) or EFTE (tetrafluoroethylene, ethylene copolymerization resin) or metal such as phosphor bronze or stainless for spring.

The holders 50 do not have a specific limitation on shape. However, preferably, the holders 50 have a shape in which the protrusions 50a are fixed into the grooves 60 so as to enhance the strength of fixing.

The grooves 60 may be provided on the underside of the semiconductor package in the lowermost position, and on the upper surface of the semiconductor package in the uppermost position. In terms of simplifying molding process, it is preferable that the grooves are provided on all the semiconductor packages.

The side surface grooves 70 may be omitted. In order to reduce the dimensions of the semiconductor device after setting the holders 50, however, the side surface grooves 70 are preferably provided on the semiconductor packages so as to avoid prevent the holders 50 from protruding from the side surface of the resin. In accordance with the embodiment, the two sides having the groove 60 and the side surface groove 70 are different from the other two sides having the leads. This arrangement may be varied so that the grooves and the leads are provided on identical sides.

The above-described embodiment has an exemplary structure in which the semiconductor chip 10 is die-bonded to the die stage 20. However, the present invention includes another structure in the absence of the die stage 20 in which the semiconductor chip 10 and the leads are connected by the bonding wires 2 and are molded with the resin.

Although a few preferred embodiments of the present invention have been shown and described, it is not limited to these and it would be appreciated by those skilled in the art that changes may be made in these embodiments without departing from the principles and spirit of the invention, the scope of which is defined in the claims and their equivalents.

I claim:

1. A semiconductor device comprising:
   a plurality of semiconductor packages arranged in a stacked configuration;
   a plurality of leads drawn from each semiconductor package and folded around the outer shape of each semiconductor package, such that the leads extend over the upper surfaces of the semiconductor package; and
   a plurality of holders to affix the semiconductor packages in the stacked configuration, so that a first and second plurality of leads contact each other, the first leads being drawn from a first one of the semiconductor packages at a lower stacking stage, and the second leads being drawn from a second one of the semiconductor packages at an upper stacking stage, and the first and second semiconductor packages positioned adjacent to each other, wherein the plurality of holders contact an upper surface of an uppermost semiconductor package and a lower surface of a lowermost semiconductor package.

2. The semiconductor device as claimed in claim 1, wherein a first height of the semiconductor package is lower than a second height thereof, the first height being of an area of the upper surface of the semiconductor package above which the leads extend, and the second height being of another area of the upper surface of the semiconductor package above which the leads do not extend.

3. The semiconductor device as claimed in claim 1, wherein:
   an uppermost one of the semiconductor packages in the stacked configuration has grooves provided on an upper surface thereof; and
   a lowermost one of the semiconductor packages in the stacked configuration has grooves provided on a lower surface thereof; and the holders engage the grooves of the uppermost and lowermost semiconductor packages.

4. The semiconductor device as claimed in claim 1, wherein the second leads are drawn from a lower surface of the second one of the semiconductor packages, and the second leads make contact with parts of the first leads that are extended over an upper surface of the first one of the semiconductor packages, wherein the stacked first and second semiconductor are positioned adjacent to each other.

5. The semiconductor device as claimed in claim 1, wherein the holders include an elastic material.

6. The semiconductor device as claimed in claim 1, wherein the holders have folded portions having a thickness less than that of other unfolded portions.

7. The semiconductor device as claimed in claim 3, wherein each semiconductor package may have grooves provided on the upper and lower surfaces thereof.

8. The semiconductor device as claimed in claim 5, wherein the holders comprise at least one of resin, metal, ceramics, or in any combination.

9. The semiconductor device as claimed in claim 8, wherein the holders comprise a material having a thermal expansion coefficient approximately equal to or smaller than that of resin.

10. The semiconductor device as claimed in claim 3, wherein the holders comprise protrusions which are fixed into the grooves provided on the grooves of the semiconductor packages.

11. The semiconductor device as claimed in claim 1, wherein a portion of a first lead extending over an upper surface of the first semiconductor package protrudes upward from the upper surface of the first semiconductor package.

12. The semiconductor device as claimed in claim 11, wherein a second lead extends along a lower surface of the second semiconductor package such that the first lead extending over the upper surface of the first semiconductor package is borne down by the second lead.

13. The semiconductor device as claimed in claim 12, wherein an elastic force is generated between the first lead and the second lead.

* * * * *